United States Patent [19]
Wakamiya et al.

[11] Patent Number: 5,225,704
[45] Date of Patent: Jul. 6, 1993

[54] FIELD SHIELD ISOLATION STRUCTURE FOR SEMICONDUCTOR MEMORY DEVICE AND METHOD FOR MANUFACTURING THE SAME

[75] Inventors: Wataru Wakamiya; Shinichi Satoh; Hiroji Ozaki; Takahisa Eimori; Yoshinori Tanaka, all of Hyogo, Japan

[73] Assignee: Mitsubishi Denki Kabushiki Kaisha, Tokyo, Japan

[21] Appl. No.: 614,963

[22] Filed: Nov. 19, 1990

Related U.S. Application Data

[63] Continuation of Ser. No. 376,662, Jul. 7, 1989, abandoned.

[30] Foreign Application Priority Data

Jul. 8, 1988 [JP] Japan .................. 63-171522
Jun. 29, 1989 [JP] Japan .................. 1-167578

[51] Int. Cl.⁵ .................. H01L 27/02; H01L 29/68; H01L 29/78
[52] U.S. Cl. .................. 257/409; 257/488; 257/491
[58] Field of Search .................. 357/51, 23.6, 53

[56] References Cited

U.S. PATENT DOCUMENTS

| | | | |
|---|---|---|---|
| 4,561,170 | 12/1985 | Doering et al. | 357/51 |
| 4,649,406 | 3/1987 | Takemae et al. | 357/51 |
| 4,650,544 | 3/1987 | Erb et al. | 357/51 |
| 4,696,092 | 9/1987 | Doering et al. | 357/51 |
| 4,754,313 | 6/1988 | Takemae et al. | 357/51 |
| 4,794,563 | 12/1988 | Maeda | 365/182 |
| 4,825,278 | 4/1989 | Hillenius et al. | 357/53 |
| 4,907,046 | 3/1990 | Ohji | 357/23.6 |

FOREIGN PATENT DOCUMENTS

| | | | |
|---|---|---|---|
| 0112670A1 | 7/1984 | European Pat. Off. | 357/23.6 |
| 2730202A1 | 1/1978 | Fed. Rep. of Germany | 357/23.6 |
| 3044132A1 | 7/1982 | Fed. Rep. of Germany | 357/23.6 |
| 60-10662 | 1/1985 | Japan | 357/51 |
| 60-047437 | 3/1985 | Japan | 357/51 |
| 61-55258 | 11/1986 | Japan | 357/51 |
| 62-160248 | 1/1987 | Japan | 357/45 |
| 62-122174 | 6/1987 | Japan | 357/51 |
| 62-162353 | 7/1987 | Japan | 357/51 |
| 62-190869 | 8/1987 | Japan | 357/51 |

OTHER PUBLICATIONS

"Self-Aligned Field Shield Process", Dennard et al., Technical Disclosure Bulletin, vol. 16, No. 2, Jul. 1974, pp. 507-508.

"Shielded Silicon Gate Complementary MOS Integrated Circuit", IEEE Transactions on Electron Devices, Lin, et al., IEEE Transactions on Electron Devices, vol. ED-19, No. 11, Nov. 1972, pp. 1190-1207.

*Primary Examiner*—Jerome Jackson
*Assistant Examiner*—D. Monin
*Attorney, Agent, or Firm*—Lowe, Price, LeBlanc & Becker

[57] ABSTRACT

In a DRAM having stacked capacitor cells, elements are isolated by field shield isolating structure. The field shield isolating structure is formed surrounding both X and Y directions of the memory cell in the DRAM. The field shield isolating structure comprises an isolating electrode layer formed on a semiconductor substrate between adjacent memory cells with an insulating film interposed therebetween. Two impurity regions included in the adjacent memory cells and the isolating electrode layer constitute a MOS transistor. A voltage for maintaining the MOS transistor normally-off is applied to the isolating electrode layer. A portion of the stacked capacitor extends to the isolating electrode layer. One of the source/drain regions of the MOS transistor is formed in self-alignment, using a sidewall spacer formed of an insulating film on a sidewall of the field shield electrode as a mask.

19 Claims, 11 Drawing Sheets

FIG.3
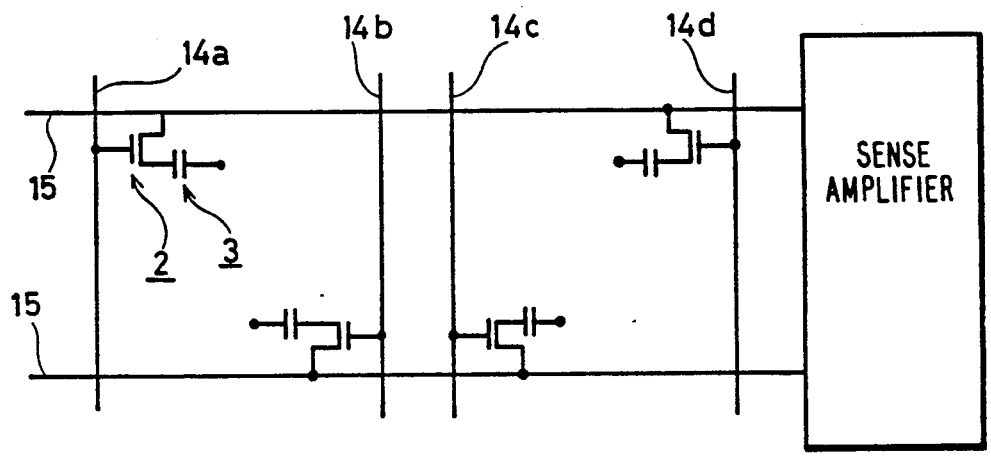
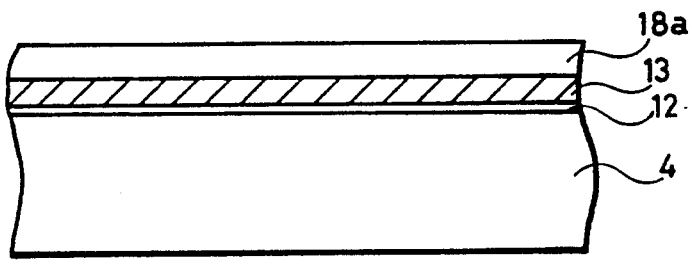
FIG.4A
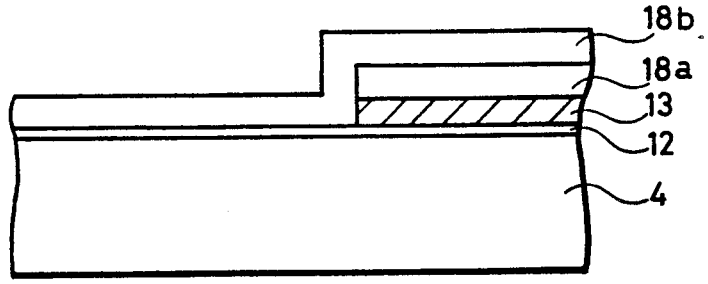
FIG.4B
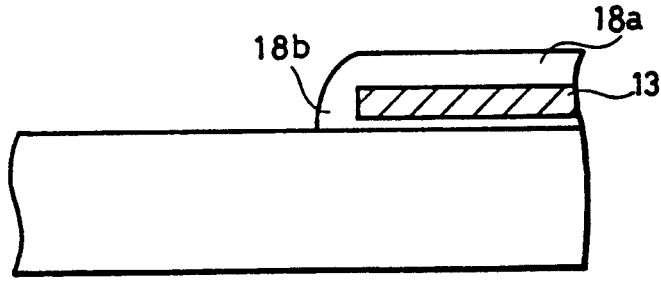
FIG.4C

FIELD SHIELD ISOLATION STRUCTURE FOR SEMICONDUCTOR MEMORY DEVICE AND METHOD FOR MANUFACTURING THE SAME

This application is a continuation of U.S. patent application Ser. No. 07/376,662 filed Jul. 7, 1989, now abandoned.

BACKGROUND OF THE INVENTION

1. Field of the Invention

The present invention relates generally to semiconductor memory devices, and, more specifically, to field shield isolation of cells within a semiconductor memory device array. The invention is also related to a manufacturing method thereof.

2. Description of the Prior Art

Recently, semiconductor memory devices are in great demand as information machines such as computers have come into wide use. Semiconductor memory devices having large memory capacitance capable of high speed operation are desired. Accordingly, the technology in association with the higher degree of integration, high speed responsiveness and higher reliability of the semiconductor memory devices has been developed.

DRAMs (Dynamic Random Access Memory) are the semiconductor memory devices capable of inputting and outputting data at random. Generally, a DRAM comprises a memory cell array which is a memory region storing a number of data, and peripheral circuits necessary for external input/output.

FIG. 5 is a block diagram showing a structure of a common DRAM. Referring to the figure, the DRAM 50 comprises a memory cell array 51 for storing data signals representing memory information; a row and column address buffer 52 for externally receiving an address signal to select a memory cell constituting a unit memory circuit; a row decoder 53 and a column decoder 54 for designating the memory cell by interpreting the address signal; a sense refresh amplifier 55 for amplifying the signal stored in the designated memory cell to read the same; a data in buffer 56 and a data out buffer 57 for inputting/outputting data, respectively; and a clock generator 58 for generating clock signals.

The memory cell array 51 occupying a large area on a semiconductor chip is constituted by an arrangement of a plurality of memory cells each storing a unit data. The improvement of the degree of integration of the memory cell array is essential in realizing higher degree of integration of the DRAM. There are mainly two methods for improving the degree of integration of the memory cell array. The first method is to miniaturize the structure of transistors and the like constituting the memory cell. The second method is to reduce area of an isolating region which insulates and isolates memory cells from each other. In the following, the latter method of reducing the element isolating region will be described.

A conventional structure for isolating elements in a memory cell array of a DRAM generally employs a thick oxide film selectively formed by LOCOS (Local Oxidation of Silicon) method. This is disclosed in, for example, Japanese Patent Laying Open No. 62-190869. In this method, a thick oxide film region is formed by the LOCOS method around a region in which an element is formed, whereby elements are insulated and isolated from each other. However, in the LOCOS method, an oxide film region called a bird's beak is formed, which extends from the periphery of the thick oxide film region to the region in which the element is formed. The bird's beak region reduces the area of the region in which the element is formed. In addition, the length of the bird's beak is constant irrespective of the reduction of the size of the entire element, so that the proportion of the area of the bird's beak to the area of the element forming region increases as the degree of integration of the structure becomes higher and higher. The bird's beak is one factor preventing higher degree of integration.

Meanwhile, FIG. 6 shows an example of the field shield isolating structure which insulates and isolates memory cells of the DRAM. Such structure is disclosed in, for example, Japanese Patent Laying-Open No. 62-10662. This figure shows a cross sectional structure of 2 bits of memory cells. The memory cell comprises one transfer gate transistor 2 and one capacitor 3, as in the above example. The field shield isolating structure is employed as the element isolating structure between adjacent memory cells. Namely, a shielding electrode layer 13 is formed on the surface of the semiconductor substrate 4 between the impurity diffused region 5a of one memory cell 1a and the impurity diffused region 5b of the other memory cell 1b with an oxide film 12 interposed therebetween. In this example, the shielding electrode 13 is connected integrally with the upper electrode 11 of the capacitor 3. By the application of a substrate potential or a lower potential to the shielding electrode 13, for example, the transistor structure constituted by the shielding electrode 13 and the impurity diffused regions 5a and 5b of the memory cells 1a and 1b is always kept at the off state. Thus the insulating isolation between the memory cells 1a and 1b can be realized.

Now, in this example, the shielding electrode 13 and the upper electrode 11 of the capacitors 3 are connected together to be set at a common potential. Therefore, it is disadvantageous when the potential of the shielding electrode 13 should be set at a desired level without influencing the capacitors 3. The element isolating structure and the memory cell structure should preferably be formed independently to increase degree of freedom in the arrangement of the memory cell and in the manufacturing process to enable application to the DRAMs having various memory cell structure. (This will be described later).

Then, field shield isolating structure having an independent field shield electrode is described in, for example, Japanese Patent Publication No. 61-55258. FIG. 7 is a plan view of a memory cell of a DRAM employing the field shield isolating structure shown in this example, and FIG. 8 shows a cross sectional structure taken along the line VII—VII of FIG. 7. Memory cells of 2 bits are shown in these figures. The memory cell 1 is constituted by a transfer gate transistor 2 and a capacitor 3. The transfer gate transistor 2 is formed of two impurity regions 5 and 6 formed on a surface region of a semiconductor substrate 4 and a gate electrode 8 formed on the surface of the semiconductor substrate 4 with a thin insulating film 7 interposed therebetween. The capacitor 3 comprises a lower electrode 9 a portion of which connected to the impurity diffused region 6 of the transfer gate transistor 2, a dielectric layer 10 formed thereon, and an upper electrode 11 covering the upper surface thereof.

The element isolating structure of the DRAM of this example will be described in the following. A shielding electric layer 13 is formed on the surface of the semiconductor substrate 4 in the element isolating region with a gate oxide film 12 for shielding interposed therebetween. A pair of adjacent memory cells (only one is shown) sandwiching the shielding electrode layer 13 are arranged such that the impurity diffused region 6 of the memory cell 1 and the shielding electrode layer 13 constitute a transistor structure. By applying a potential of approximately the same level as the substrate to the shielding electrode layer 13, for example, the transistor structure becomes a normally-off transistor structure in which there will be no conduction between adjacent memory cells. Thus the insulating isolation between elements is realized.

Although the above described field shield isolating structure is employed for isolating elements in the X direction of FIG. 6, the isolating structure employing a thick oxide film provided by the LOCOS method is still used for isolating elements in the Y direction for isolating elements in the memory cell of this example. Therefore, as for the structure of the isolating region in the Y direction, there are still factors preventing higher degree of integration such as bird's beak.

SUMMARY OF THE INVENTION

One object of the invention is to provide isolation between cells of a semiconductor memory device array.

Another object of the invention is to provide improved isolation between cells of a stacked capacitor type semiconductor memory device array.

Another object is to provide field isolation extending in both X- and Y-directions of a semiconductor memory device array.

A further object is to provide electrical isolation between the capacitor and field isolation electrodes of a field isolated semiconductor memory device array.

Another object is to improve miniaturization of a field isolated semiconductor memory device array.

Another object is to provide independently controlled insulation characteristics between the field electrode and gate electrode of a field isolated semiconductor memory device array.

A semiconductor memory device of the present invention comprises a memory region in which a plurality of unit memory cells are arranged in matrix, each circuit constituted by a switching element and a signal storing passive element. The unit memory cells included in the memory region are surrounded by an isolating region so as to be insulated and isolated from each other. The isolating region comprises an element isolating electrode layer formed on the surface of the semiconductor substrate positioned in the isolating region with an oxide film interposed therebetween. An impurity region of a first switching element and an impurity region of a second switching element adjacent with each other sandwiching the isolating region are formed in self-alignment in association with the element isolating electrode layer. A portion of the signal storing passive element is formed extended to an upper portion of the isolating electrode layer.

As described above, the memory region of the semiconductor memory device of the present invention employs a so-called field shield isolating structure as the isolating structure insulating and isolating unit memory circuits from each other. In this structure, a transistor structure is formed by an oxide film and an electrode layer for isolating elements formed on the surface of the semiconductor substrate in the element isolating region and impurity regions of switching elements formed on both sides of the element isolating region. The transistor structure becomes a normally-off transistor in which no channel is formed on the surface of the semiconductor substrate in the element isolating region by applying a ground potential or a negative potential to the electrode layer for isolating elements. Consequently, semiconductor elements positioned on both sides of the isolating region can be in insulated and isolated from each other.

Unlike the conventional LOCOS isolating method, unnecessary regions such as bird's beak are not formed in the regions in which elements are formed in this isolating method. Therefore, the element isolating region can be minimized, thereby realizing higher degree of integration of the semiconductor memory device.

In a memory cell of a DRAM employing the conventional field shield isolating structure, an insulating film covering the field shield electrode is patterned by lithography including a step of mask alignment. Therefore, regions to be patterned of the insulating film formed on the substrate surface must be enlarged in consideration of errors in the mask alignment, which prevents miniaturization of the memory cell.

A still further object of the present invention is to provide a method for manufacturing a field shield isolating structure enabling minimization of semiconductor memory devices.

In another aspect of the present invention, the insulating film surrounding a conductive layer constituting the semiconductor memory device is formed in accordance with the steps of (a) forming a stacked layer structure of a conductive layer and a second insulating film on a first insulating film;

(b) patterning the conductive layer and the second insulating film to a prescribed pattern, thereby exposing side surfaces of the conductive layer;

(c) forming a third insulating film on the exposed side surfaces of the conductive layer and on the surface of the second insulating film formed only on the upper surface of the conductive layer; and (d) anisotropically etching the second and third insulating films to leave insulating film on the conductive layer and forming side walls of insulating films on the side surfaces.

In the above described steps, the patterning of the insulating film is carried out not employing the lithography method. Therefore, the manufacturing can be simplified. In addition, it is not necessary to take errors in mask alignment in consideration, whereby the patterns of the semiconductor device can be minimized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is an equivalent circuit diagram of the memory cell array shown in FIG. 1;

FIGS. 4A, 4B, 4C, 4D, 4E, 4F and 4G are cross sectional views successively showing steps of manufacturing the memory cell of the DRAM of the present invention;

DESCRIPTION OF THE PREFERRED EMBODIMENTS

One embodiment of the present invention will be described in the following with reference to the figures.

Figure 1:
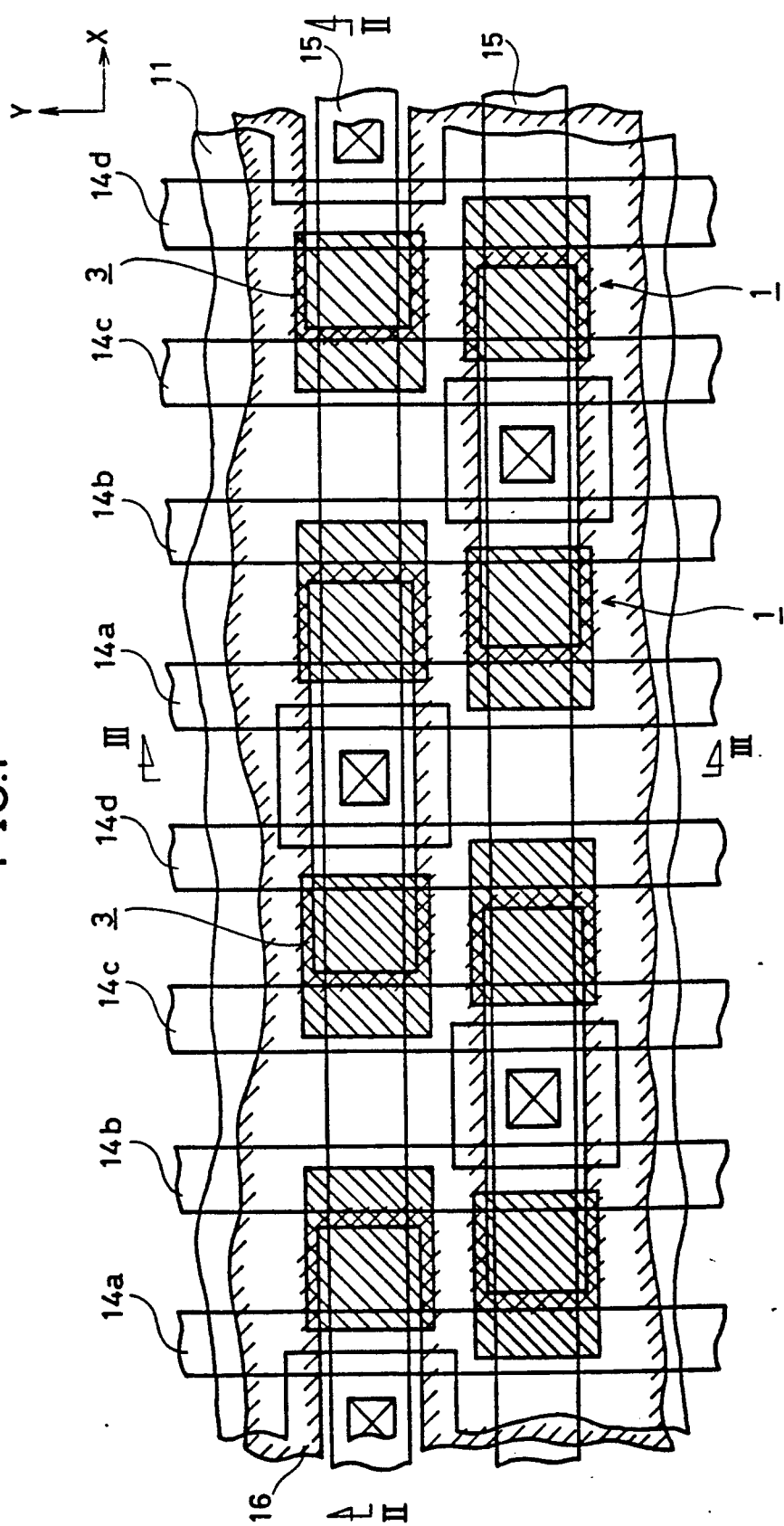
FIG. 1 is a plan view showing a portion of a memory cell array of a DRAM in accordance with one embodiment of the present invention.
Figure 2A:
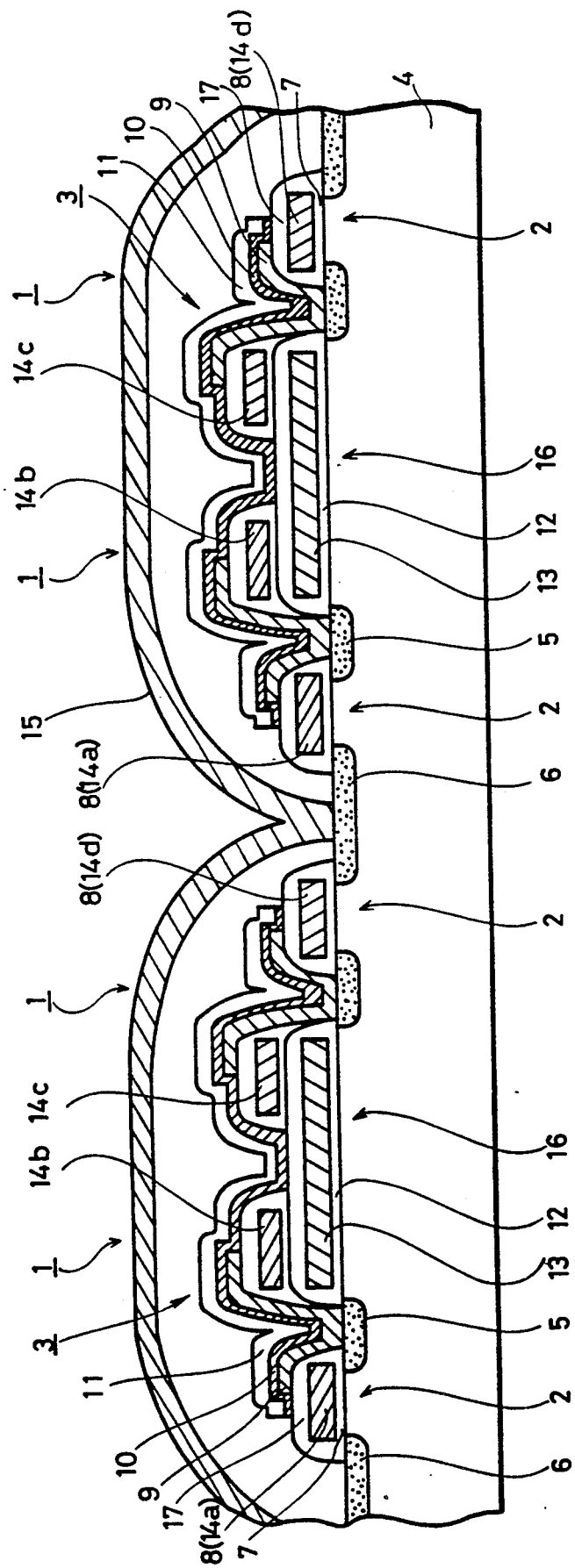
FIG. 2A is a cross sectional view taken along the line II—II of FIG. 1.
Figure 2B:
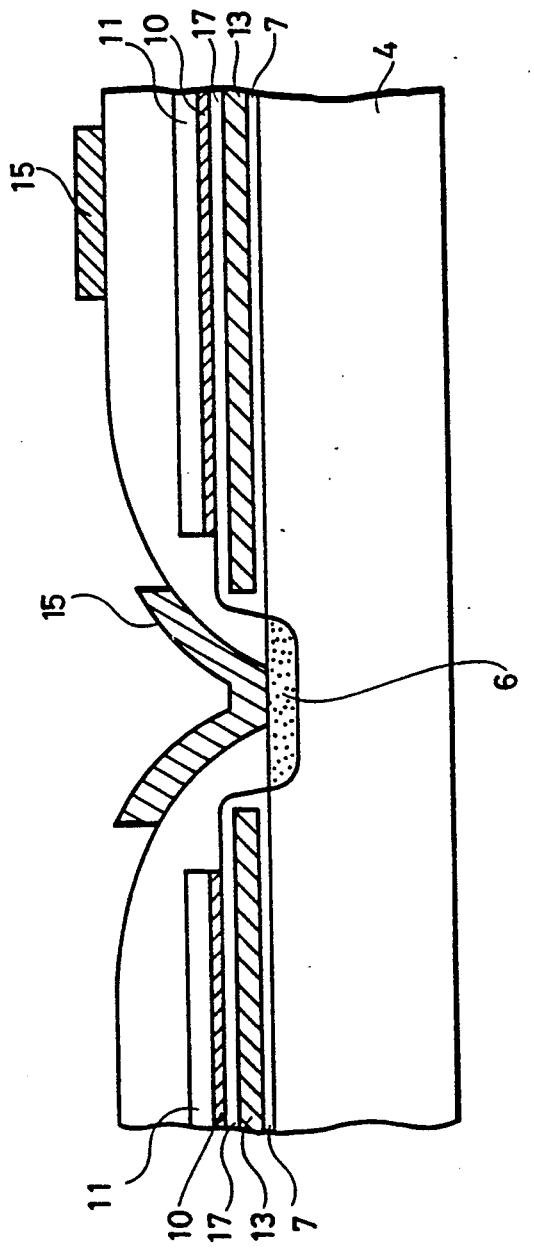
FIG. 2B is a cross sectional view taken along the line III—III of FIG. 1.

Referring to FIGS. 1, 2A and 2B, memory cells of 8 bits of a DRAM are shown in these figures. The memory cell array shown in these figures have so-called folded bit line type structure. The memory cell array comprises word lines 14a, 14b, 14c and 14d extending in the longitudinal direction of the sheet and bit lines 15 extending in the direction orthogonal to the word lines. Memory cells 1 are formed at respective intersections between the word lines 14a~14d and the bit lines 15. The memory cell 1 comprises one transfer gate transistor (switching element) 2 and one capacitor (signal storing passive element) 3. An isolating region 16 having the field shield isolating structure extends in both X- and Y-directions of the memory cell 1.

Two impurity diffused regions 5 and 6 are formed spaced apart from each other on the surface region of the semiconductor substrate 4. A gate electrode 8 (word line 14a) is formed on the surface of the semiconductor substrate which is sandwiched by the impurity diffused regions 5 and 6 with a gate oxide film 7 interposed therebetween. The gate electrode 8, the gate oxide film 7 and the impurity diffused regions 5 and 6 constitute the transfer gate transistor 2.

A lower electrode 9 of the capacitor 3 is formed on the surface of the gate electrode 8 with an insulating film 17 interposed therebetween. A portion of the lower electrode 9 is connected to the impurity diffused region 5 of the transfer gate transistor 2. The other side of the lower electrode 9 extends to the surface of the element isolating region 16. In addition, a thin dielectric layer 10 is formed on the surface of the lower electrode 9. An upper electrode 11 is formed thereon to cover the entire surface. The lower electrode 9, the dielectric layer 10 and the upper electrode 11 constitute the capacitor 3.

A shielding electrode layer 13 is formed on the surface of the semiconductors substrate 4 positioned in the element isolating region 16 with a gate oxide film 12 interposed therebetween. The shielding electrode layer 13 is formed such that it is sandwiched by the impurity diffused regions 5, 5 of the transfer gate transistor 2 formed on both sides of the element isolating region 16. The impurity diffused regions 5, 5, the gate oxide film 12 and the shielding electrode layer 13 constitute an insulating isolating transistor. The operation of the field shield isolating structure employing the insulating isolating transistor structure will be described. In this method, the formation of a channel between impurity diffused regions 5, 5 of the adjacent transfer gate transistors 2 which renders these transistors conductive can be prevented by applying a ground potential or a negative potential from the shielding electrode layer 13 to the surface of the semiconductor substrate. Therefore, the threshold voltage of the insulating isolating transistor is enhanced by making thick the oxide film 12, the voltage to be applied to the shielding electrode layer 13 is adjusted to a low voltage, and so on, so as to set suitable conditions in accordance with the isolating characteristics of the memory cell through these measures.

In the memory cell structure shown in this figure, a word line 14b is formed on the surface of the shielding electrode layer 13 with an insulating film 17 interposed therebetween, with the word line connected to other memory cells.

FIG. 3 is an equivalent circuit diagram of the memory cells for 4 bits in the memory cell array of this embodiment.

The method for manufacturing the memory cell of the present embodiment will be described step by step with reference to FIGS. 4A to 4G.

First, as shown in FIG. 4A, a gate oxide film 12 for field shielding is formed on a surface of a semiconductor substrate 4 by thermal oxidation. Then, a polysilicon layer 13 is formed on the surface by CVD (Chemical Vapor Deposition) method, and an oxide film 18a is formed thereon by the CVD method.

Thereafter, as shown in FIG. 4B, the oxide film 18 and the polysilicon layer 13 are patterned by photolithography and etching. Next, an oxide film 18b is formed on the entire surface by the CVD method.

Thereafter, as shown in FIG. 4C, anisotropic etching is carried out on the oxide film 18b to form a sidewall 18 on the side of the shielding electrode layer 13 and to leave the oxide film 18a on the surface of the shielding electrode layer 13.

Figure 4D:
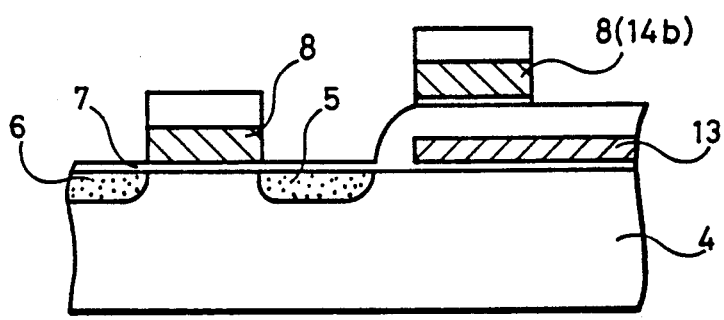

As shown in FIG. 4D, a thin gate oxide film 7 is formed on the surface of the semiconductor substrate 4, and a polysilicon layer and an oxide film are successively stacked thereon by the CVD method. The oxide film and the polysilicon layer are patterned by photolithography and etching to form the word line 14b and the gate electrode 8 constituting the word line (14a). Impurities are ion implanted to the surface of the semiconductor substrate using the gate electrode 8 and the oxide film stacked on the surface thereof as masks, thereby forming impurity diffused regions 5 and 6. The impurity diffused region 5 formed by the ion implantation is in self-alignment in association with the gate electrode 8 and the shielding electrode layer 13.

Figure 4E:
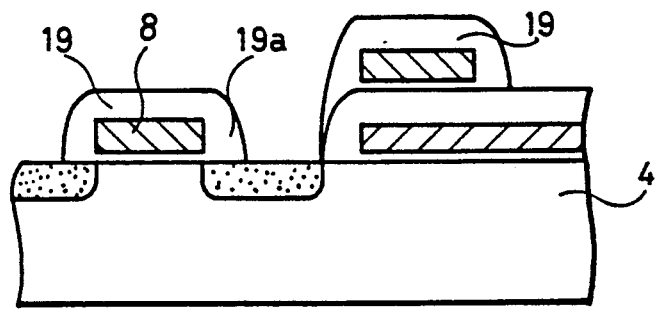

Thereafter, as shown in FIG. 4E, an oxide film 19 is stacked on the surface of the semiconductor substrate 4 where the gate electrode 8 is formed. By anisotropically etching the oxide film 19, a sidewall 19a of the oxide film is newly formed on the sidewall of the gate electrode 8.

Figure 4F:
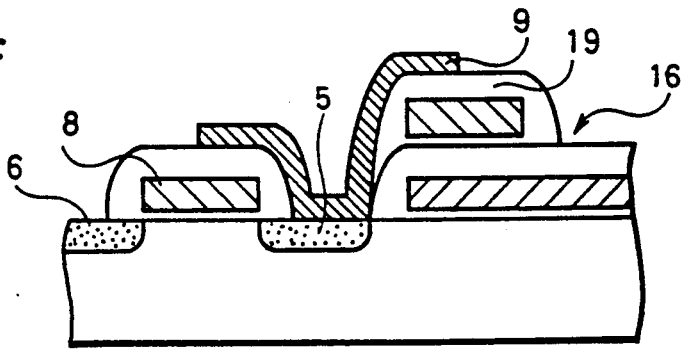

A polysilicon layer is stacked by the CVD method, and by patterning the same, the lower electrode 9 of the capacitor 3 is formed, as shown in FIG. 4F. The lower electrode 9 extends from the surface of the gate electrode 8 of the transfer gate transistor to the surface of the gate electrode 8 passing along the surface of the element isolating region 16. One portion thereof is stacked to be connected on the surface of the impurity diffused region 5 of the transfer gate transistor 2.

Figure 4G:
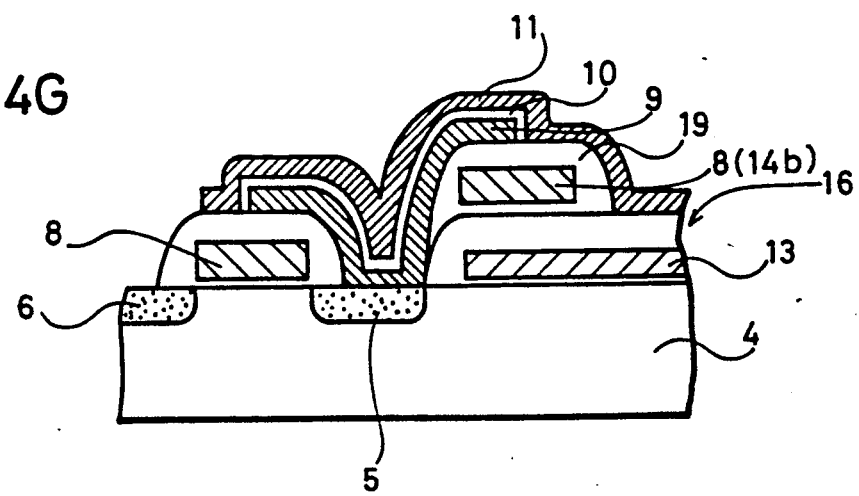
Figure 5:
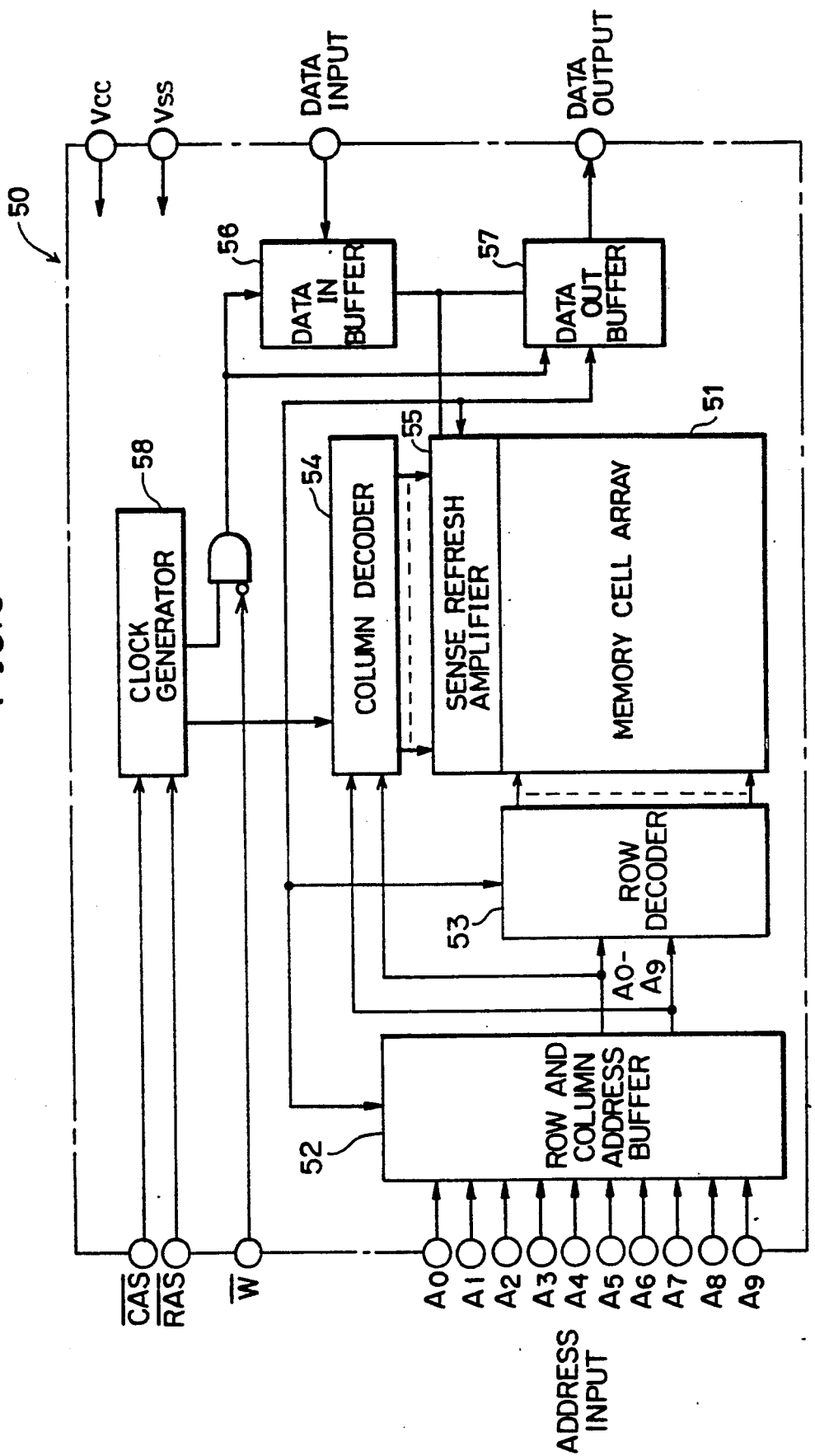
FIG. 5 is a block diagram showing a structure of a common DRAM.
Figure 6:
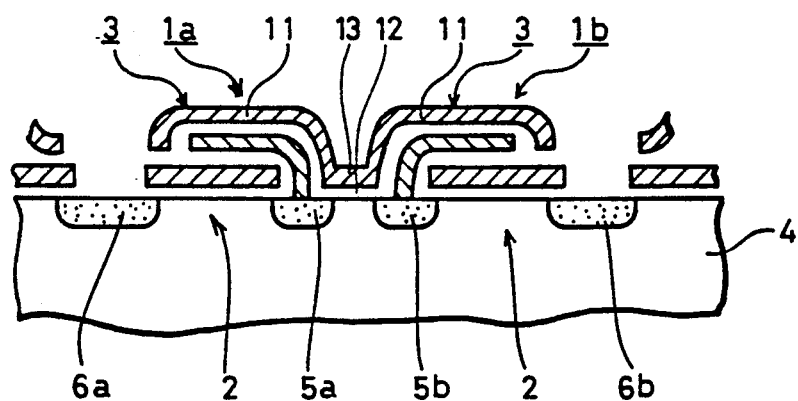
FIG. 6 is a cross sectional view of a memory cell of a conventional DRAM, which is a second example.
Figure 7:
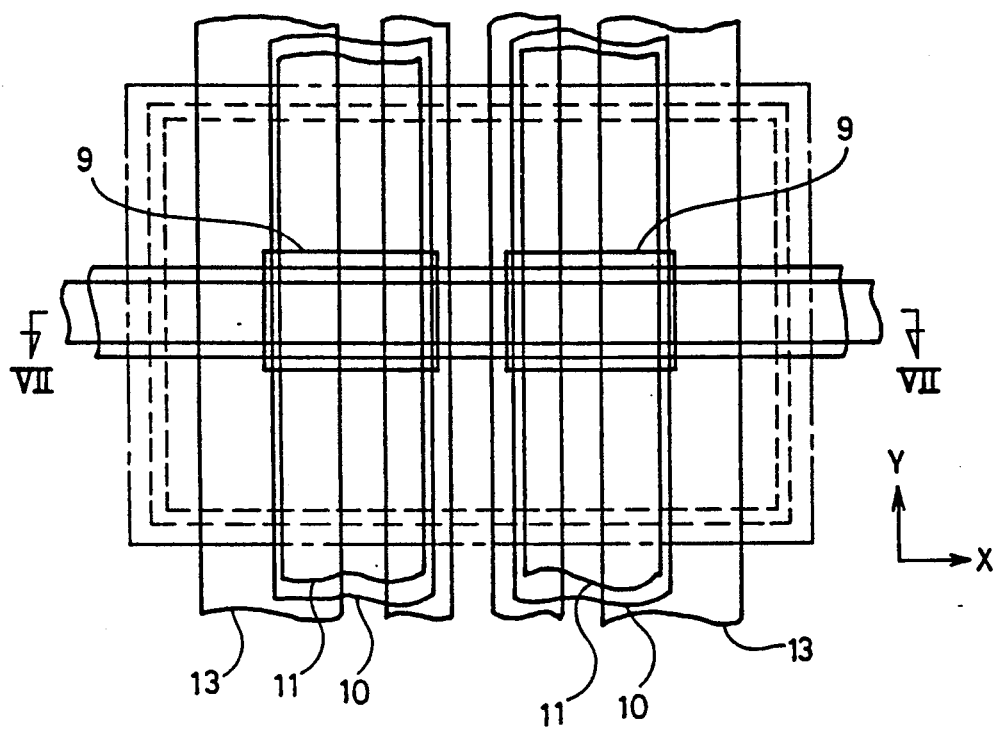
FIG. 7 is a plan view showing a structure of a memory cell-array of a conventional DRAM.
Figure 8:
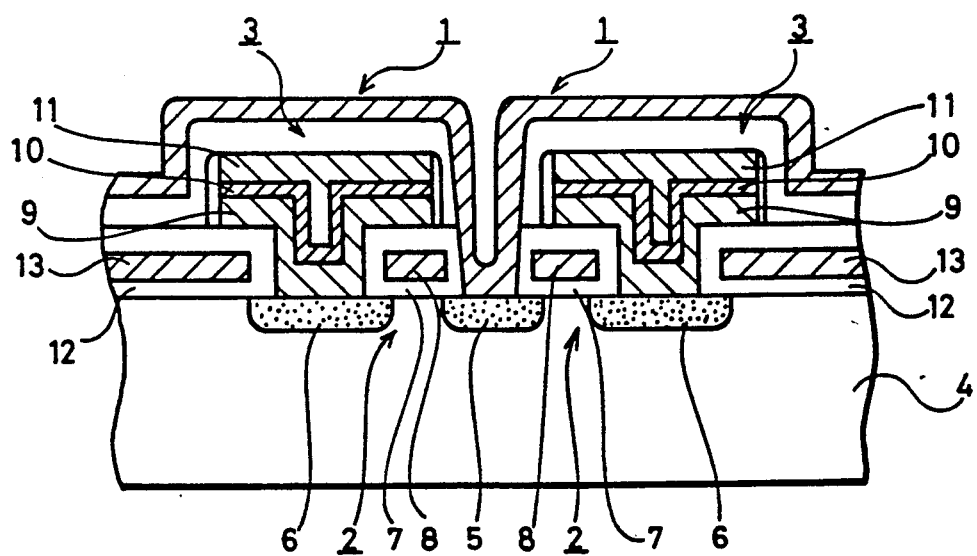
FIG. 8 is a cross sectional view taken along the line VII—VII of FIG. 7.

Thereafter, as shown in FIG. 4G, a silicon nitride film is formed on the surface of the lower electrode 9 and the like by the CVD method, and by thermal oxidation of the surface, the dielectric layer 10 of the capacitor 3 is formed. A polysilicon layer is stacked thereon by the CVD method, and it is patterned to form the upper electrode 11 of the capacitor 3.

A memory cell array of a DRAM can be manufactured through the above described the steps in which memory cells each comprising one transfer gate transistor 2 and one capacitor 3 are insulated and isolated from each other by the field shield isolating structure. The characteristics of the memory cell formed through such manufacturing process are as follows.

(a) Processes for manufacturing the shielding electrode layer 13 and the like of the field shielding structure forming the element isolating region are independently carried out prior to the manufacturing of the transfer gate transistor and the capacitor constituting the memory cell. Therefore, the film thickness of the gate oxide film 12 for field shielding and the thickness of the shielding electrode layer 13 can be arbitrarily selected. This enables arbitrarily setting of the insulating and isolating characteristics corresponding to the characteristics of various memory cell arrays.

(b) The capacitor 3 can be formed extended from the upper portion of the gate electrode 8 (word lines 14a, 14d) of the transfer gate transistor 2 to the upper portion of the gate electrode 8 (word lines 14b, 14c) of another transfer gate transistor passing through the upper portion of the element isolating region 16. Consequently, that junction area of the capacitor can be increased, and therefore the capacitance can be increased.

Modifications of a memory cell of a DRAM having the field shield isolation structure are shown in FIGS. 9 to 14. These modifications are characterized by the structure of the capacitor in the memory cell.

Figure 9:
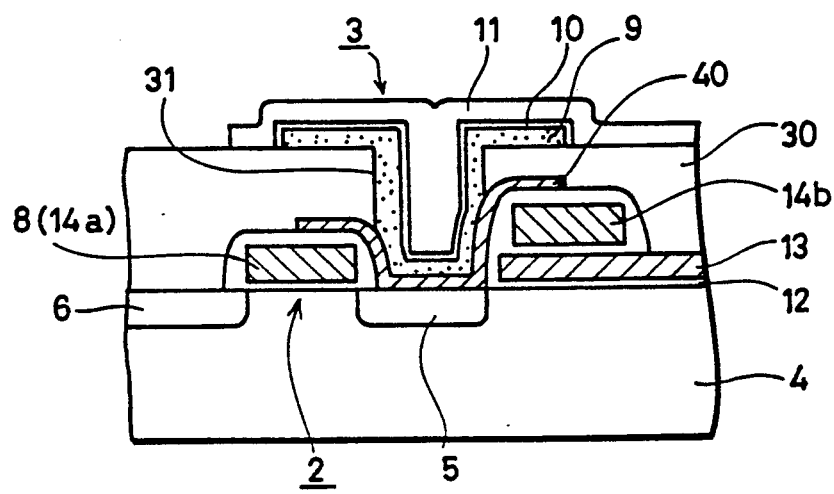
FIG. 9 is a cross sectional view showing a structure of a first modification of the memory cell of the DRAM in accordance with the present invention.

Referring to FIG. 9, the memory cell of the first modification comprises an opening 31 formed in an interlayer insulating film which is formed thick and flat on the main surface of the semiconductor substrate 4. A conductive layer 40 is formed on a surface of one impurity diffused region of a transfer gate transistor. The conductive layer 40 further extends from above the gate electrode 8 to the upper portion of the word line 14b. The opening 31 reaches the surface of the conductive layer 40. A lower electrode 9, a dielectric layer 10 and an upper electrode 11 of the capacitor 3 are formed in this order from the bottom along the inner surface and upper edge of the opening 31.

Figure 10:
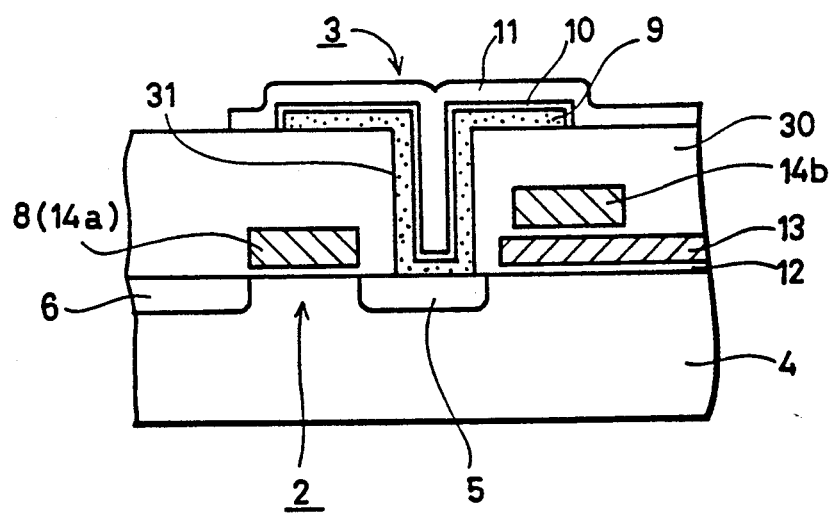
FIG. 10 is a cross sectional view showing a structure of a second modification of the memory cell of the DRAM in accordance with the present invention.

Referring to FIG. 10, the conductive layer 40 shown in the first modification is omitted in the memory cell of the second modification. The lower electrode 9 formed in the opening 31 is directly connected to the impurity region 5.

Figure 11:
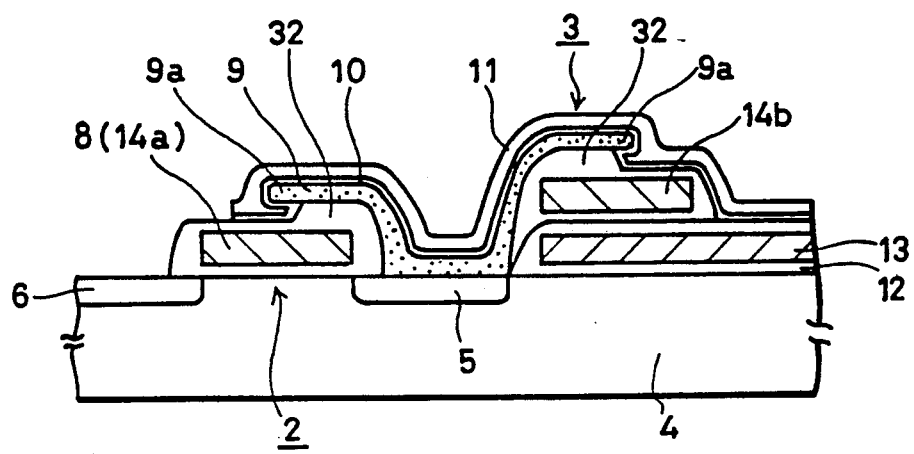
FIG. 11 is a cross sectional view showing a structure of a third modification of the memory cell of the DRAM in accordance with the present invention.

Referring to FIG. 11, in the capacitor 3 of the memory cell in accordance with the third modification, a portion of the lower electrode 9 has a projection 9a spaced apart from the lower insulating film 32. The dielectric layer 10 and the upper electrode 11 are formed to cover the surface of the projection 9a of the lower electrode 9.

Figure 12:
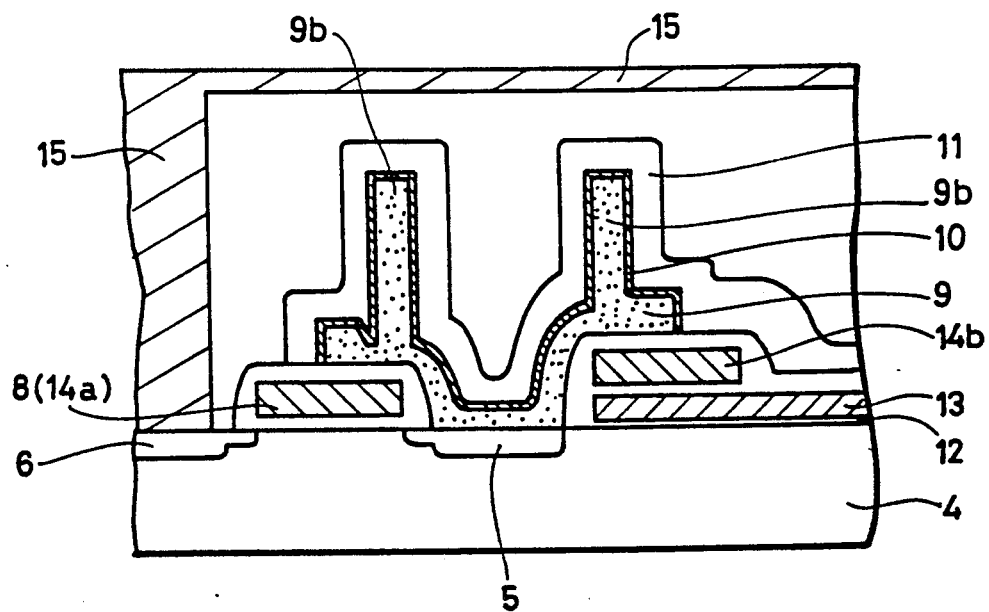
FIG. 12 is a cross sectional view showing a structure of a fourth modification of the memory cell of the DRAM in accordance with the present invention.

Referring to FIG. 12, a portion of the lower electrode 9 has an erected wall portion 9b projecting vertically upward in the capacitor 3 of the memory cell in accordance with the fourth modification. The dielectric layer 10 and the upper electrode 11 are formed to cover the surface of the lower electrode 9 having the erected wall portion 9b.

Figure 13:
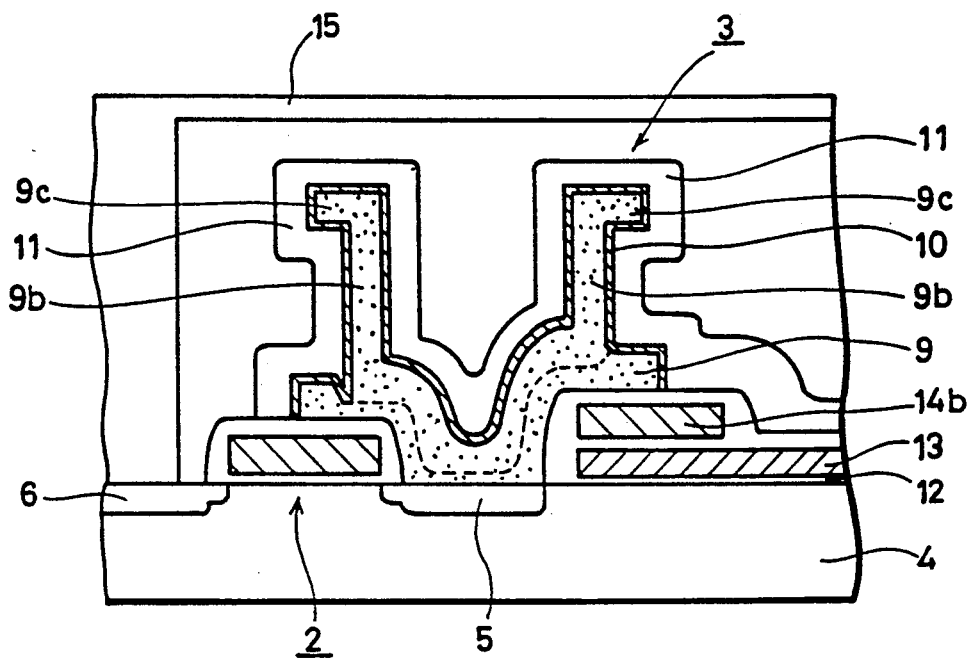
FIG. 13 is a cross sectional view showing a structure of a fifth modification of the memory cell of the DRAM in accordance with the present invention.

Referring to FIG. 13, in the capacitor 3 of the memory cell in accordance with the fifth modification, a portion of the lower electrode 9 has an erected wall portion 9b projecting vertically upward and a projection 9c extending in the horizontal direction from upper end of the erected wall portion 9b. The dielectric layer 10 and the upper electrode 11 are formed to cover the surface of the lower electrode 9 having the erected wall portion 9b and the projection 9c.

Figure 14:
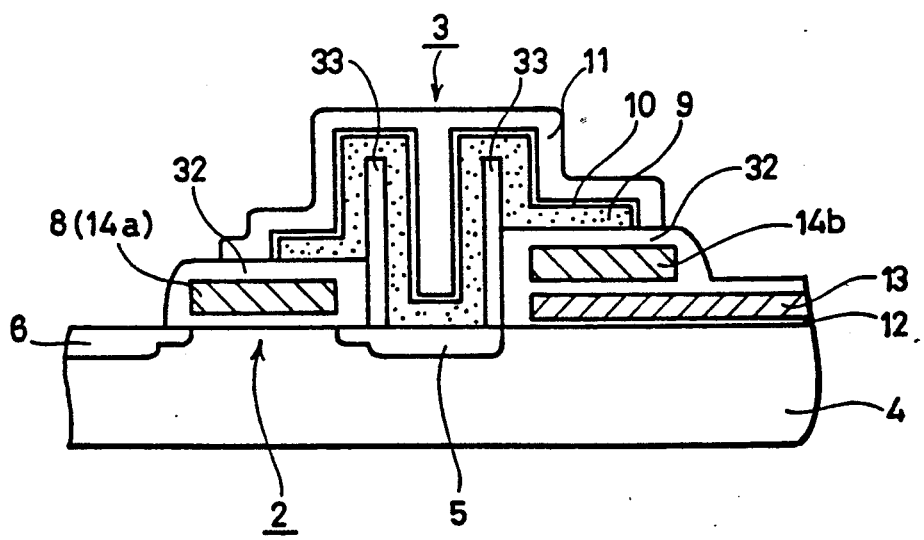
FIG. 14 is a cross sectional view showing a structure of a sixth modification of the memory cell of the DRAM in accordance with the present invention.

Referring to FIG. 14, in the memory cell in accordance with the sixth modification, there is a projection 33 formed of an insulating material or a conductive material projecting upward from the surface of the impurity region 5. The lower electrode 9 is formed to cover the surface of the projection 33. The dielectric layer 10 and the upper electrode 11 are formed along the surface of the lower electrode 9.

Although the structure of the memory cell array is so called folded bit line type in the above described embodiment, it is not limited to this, and the present invention can be also applied to the open bit line type structure, for example.

As described above, in the present invention, the field shield isolating structure is formed electrically independent from other elements. Consequently, the insulating and isolating characteristics can be controlled independently, improving the insulating characteristics.

The element isolating region can be reduced in a DRAM having the stacked capacitor cell to which the present invention is applied. In accordance with the manufacturing method of another aspect of the present invention, the impurity regions of the transfer gate transistor can be formed in self-alignment, reducing the area of the impurity regions. From this effect, the degree of integration of the semiconductor memory device can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
 a substrate having element forming regions in which semiconductor elements are formed and an element isolating region entirely surrounding each element forming region to provide a plurality of element forming regions independent from each other;
 word lines and bit lines disposed substantially normal to one another on said substrate;

a memory cell formed in said element forming region at a position where said word lines and said bit lines cross, said memory cell having a switching element including two spaced impurity regions on said semiconductor substrate in said element forming region and a first conductive layer on a surface of said semiconductor substrate between said two impurity regions, and a signal storing passive element with a first electrode layer connected to one of said impurity regions of said switching element, a dielectric film overlying said first electrode layer and a second electrode layer overlying said dielectric film;

said element isolating region comprising an isolating electrode overlying the surface of said semiconductor substrate in the element isolating region;

an oxide film of uniform thickness throughout interposed between said isolating electrode and said substrate;

an impurity region forming part of a first switching element an impurity region forming part of a second switching element adjacent each other being disposed on opposite sides of said element isolating region in alignment with said element isolating electrode;

said isolating electrode and said word lines being positioned so that multiple word lines overlap said isolating electrode.

2. A semiconductor memory device according to claim 1, wherein a part of said signal storing passive element overlies an upper portion of said element isolating electrode layer.

3. A semiconductor memory device according to claim 1, wherein two memory cells are arranged in said element forming region.

4. A semiconductor memory device according to claim 1, wherein said element isolating region surrounding said element forming region comprises a second conductive layer extending in parallel to said first conductive layer of said switching element formed in said element forming region, and
said signal storing passive element is formed extending from an upper portion of said switching element to an upper portion of said second conductive layer.

5. A semiconductor memory device according to claim 1, wherein
said semiconductor memory device is a dynamic random access memory having memory cells each including a transfer gate transistor and a capacitor, said switching element being the transfer gate transistor and said signal storing passive element being said capacitor.

6. A semiconductor memory device according to claim 4, wherein
said semiconductor memory device is a dynamic random access memory having memory cells each including a transfer gate transistor and a capacitor, said switching element being the transfer gate transistor and said signal storing passive element being said capacitor.

7. The device of claim 1, wherein said first electrode layer and said word lines are positioned so that both ends of said first electrode layer terminate above and within the lateral extent of word lines subtended thereby.

8. The device of claim 7, wherein said first electrode layer, said dielectric film and said second electrode layer are arranged in part over at least one of said word lines overlying said isolating electrode to form a stacked high-capacitance structure.

9. A semiconductor memory device, comprising:
a semiconductor substrate;
a plurality of word lines arranged in parallel in a row direction on the main surface of said semiconductor substrate;
a plurality of bit lines arranged in parallel in a column direction on the main surface of said semiconductor substrate;
an isolating electrode disposed on a first insulator on the main surface of said semiconductor substrate underlying a second insulator beneath and overlapping multiple said word lines in at least the column direction;
a plurality of memory cells arranged in the row and column directions to form a matrix, each said memory cell being entirely surrounded by said isolating electrode and including one transistor and one storage means, said transistor having a gate electrode on a gate insulator, said gate electrode comprising a portion of said word lines adjacent opposite sides of said isolating electrode in the column direction, and a pair of source and drain regions formed in the main surface of said semiconductor substrate at both sides of said gate electrode, said storage means including one electrode overlying said substrate and connected to one of said source and drain regions in proximity to said isolating electrode, said one electrode overlying a third insulator and one word line disposed above said isolating electrode at one side thereof and overlying a fourth insulator and said gate electrode at the other side thereof, and another electrode disposed above an insulator overlying said one electrode, the other of said source and drain regions of said transistor being connected to a bit line arranged in a corresponding column.

10. A semiconductor memory device according to claim 9, wherein
said one electrode has an erected wall portion projecting vertically upward.

11. A semiconductor memory device according to claim 10, wherein
said erected wall portion of said electrode further comprises a projecting portion extending in the horizontal direction from an upper end of said erected wall portion.

12. A semiconductor memory device according to claim 9, wherein
said one electrode comprises a projecting portion projecting in a direction parallel to the main surface of said semiconductor substrate apart from said third and fourth insulators.

13. A semiconductor memory device according to claim 9, further comprising:
an erected wall portion formed of an insulator or a conductor extending vertically upward from the surface of one of the source/drain regions adjacent to said isolating electrode,
at least a portion of said one electrode formed to cover the surface of said erected wall portion.

14. The device of claim 9, wherein said one electrode is positioned so that a first edge thereof terminates above and within the lateral extent of said one word line subtended thereby and a second edge thereof terminates above and within the lateral extent of said gate electrode subtended thereby.

15. The device of claim 14, wherein said one electrode, said insulator overlying said one electrode and said other electrode are partly arranged over at least one of said word lines overlying said isolating electrode to form a stacked high capacitance structure.

16. A semiconductor memory device, comprising:
a semiconductor substrate;
a plurality of word lines arranged in parallel in the row direction on the main surface of said semiconductor substrate;
a plurality of bit lines arranged in parallel in the column direction on the main surface of said semiconductor substrate;
an isolating electrode formed above a first insulator on the main surface of said semiconductor substrate and disposed under and overlapping two of said word lines under a second insulator in at least the column direction;
a plurality of memory cells arranged in the row and column directions to form a matrix, each said memory cell being entirely surrounded by said isolating electrode and including one transistor and one storage means, said transistor having a gate electrode formed above a gate insulator by a portion of said word lines adjacent said isolating electrode in the column direction, and a pair of source and drain regions formed in the main surface of said semiconductor substrate at both sides of said gate electrode, said storage means including one electrode formed on a flat surface of and through an opening in an interlayer insulating film overlying said substrate and isolating electrode and having an opening communicating with said one of the source/drain regions of said transistor formed on the main surface of said semiconductor substrate, a portion of said one electrode connected to said one of the source/drain regions of said transistor, and another electrode formed over an insulator overlying said one electrode, the other of said source and drain electrodes of said transistor being connected to the bit lines arranged in a corresponding column.

17. A semiconductor memory device according to claim 16, further comprising a conductive layer formed on the surface of one of said source/drain regions of said transistor connected to said one electrode layer.

18. The device of claim 16, wherein said one electrode and said word lines are positioned so that ends of said electrode terminate above and within the lateral extent of said word lines being subtended thereby.

19. The device of claim 18, wherein said one electrode, said insulating overlying said one electrode and said other electrode are arranged over at least one of said word lines overlying said isolating electrode to form a stacked high capacitance structure.

* * * * *

UNITED STATES PATENT AND TRADEMARK OFFICE
CERTIFICATE OF CORRECTION

PATENT NO. : 5,225,704
DATED : July 6, 1993
INVENTOR(S) : Wataru WAKAMIYA et al.

It is certified that error appears in the above-indentified patent and that said Letters Patent is hereby corrected as shown below:

On the Title Page, Item [54], please delete and insert the following:

--FIELD SHIELD ISOLATION STRUCTURE FOR SEMICONDUCTOR MEMORY DEVICE--

Signed and Sealed this

Tenth Day of May, 1994

Attest:

BRUCE LEHMAN

*Attesting Officer*     *Commissioner of Patents and Trademarks*